(12) United States Patent
Marpe et al.

(10) Patent No.: US 6,943,710 B2
(45) Date of Patent: Sep. 13, 2005

(54) METHOD AND ARRANGEMENT FOR ARITHMETIC ENCODING AND DECODING BINARY STATES AND A CORRESPONDING COMPUTER PROGRAM AND A CORRESPONDING COMPUTER-READABLE STORAGE MEDIUM

(75) Inventors: Detlef Marpe, Berlin (DE); Thomas Wiegand, Berlin (DE)

(73) Assignee: Faunhofer-Gesellschaft zur Foerderung der Angewandten Forschung E.V., Munich (DE)

(*) Notice: Subject to any disclaimer, the term of this patent is extended or adjusted under 35 U.S.C. 154(b) by 0 days.

(21) Appl. No.: 10/727,801

(22) Filed: Dec. 4, 2003

(65) Prior Publication Data

US 2004/0117714 A1 Jun. 17, 2004

Related U.S. Application Data

(63) Continuation of application No. PCT/EP03/04654, filed on May 2, 2003.

(30) Foreign Application Priority Data

May 2, 2002 (DE) ........................................ 102 20 962

(51) Int. Cl.$^7$ ............................................... H03M 7/00
(52) U.S. Cl. ..................................... 341/106; 341/107
(58) Field of Search ................................. 341/106, 107, 341/50, 65; 382/239

(56) References Cited

U.S. PATENT DOCUMENTS

| | | | | |
|---|---|---|---|---|
| 4,891,643 A | * | 1/1990 | Mitchell et al. | ............ 341/107 |
| 5,272,478 A | * | 12/1993 | Allen | ......................... 341/107 |
| 5,363,099 A | * | 11/1994 | Allen | ......................... 341/107 |
| 5,475,388 A | * | 12/1995 | Gormish et al. | ............ 341/107 |
| 5,592,162 A | | 1/1997 | Printz et al. | |
| 5,973,626 A | * | 10/1999 | Berger et al. | .................. 341/65 |
| 6,075,471 A | * | 6/2000 | Kimura et al. | .............. 341/107 |
| 6,449,393 B1 | * | 9/2002 | Peters | ......................... 382/239 |
| 6,757,436 B2 | * | 6/2004 | Peters | ......................... 382/239 |
| 2005/0012648 A1 | * | 1/2005 | Marpe et al. | |
| 2005/0027521 A1 | * | 2/2005 | Gavrilescu et al. | |

OTHER PUBLICATIONS

Dan Chevion et al.: "High Efficiency, Multiplication Free Approximation of Arithmetic Coding", *IEEE 1991, Order No. TH0373–1/91/0000/0043/$01.00*, pp. 43–52, Apr. 8–11, 1991.

David S. Taubman et al.: "JPEG2000 Image Compression Fundamentals, Standards and Practice", *Kluwer Academic Publishers, Boston, 2002*, pp. 65–77, (Aug. 1, 2002).

Ref 1.01: Title: Draft ITU–T Recommendation and Final Draft International Standard Joint Video Specification (ITU–T Rec. H.2641 ISO/IEC 14496–10 AVC). From: Joint Video Team (JVT) of ISO/IEC MPEG & ITU–T VCEG (ISO/IEC JTC1/SC29/WG11 and ITU–T SG16 Q.6). pp.: 1–250, Mar. 7–14, 2003.

(Continued)

*Primary Examiner*—Jean Bruner Jeanglaude
(74) *Attorney, Agent, or Firm*—Laurence A. Greenberg; Werner H. Stemer; Ralph E. Locher

(57) ABSTRACT

A method and arrangement for arithmetic encoding/decoding is described, wherein the probability estimation is performed by a finite state machine FSM, wherein the generation of N representative states of the FSM is performed offline. Corresponding transition rules are filed in the form of tables. In addition, a pre-quantization of the interval width R to a number of K pre-defined quantization values is carried out. With suitable dimensioning of K and N, this allows the generation of a table containing all K×N combinations of pre-calculated product values R×$P_{LPS}$ for a multiplication-free determination of $R_{LPS}$. Overall, the result is a good compromise between high coding efficiency and low calculation effort.

63 Claims, 4 Drawing Sheets

---

1. Determination of the LPS
2. Calculation of the Variables $R_{LPS}$ and $R_{MPS}$:

$R_{LPS} = R \times P_{LPS}$
    $R_{MPS} = R - R_{LPS}$

3. Calculation of the new partial interval:
    ```
    if (bit = LPS) then
        L ← L + R_{MPS}
        R ← R_{LPS}
    else
        R ← R_{MPS}
    ```
4. Updating the probability estimation $P_{LPS}$
5. Outputting the bits and renormalizing R

OTHER PUBLICATIONS

Ref 1.02: Title: Overview of the H.264/AVC Video Coding Standard. Author: Thomas Wiegand, Gary J. Sullivan, Senior Member, IEEE, Gisele Bjontegaard, and Ajay Luthra, Senior Member, IEEE. pp.: 560–576, vol. 13, No. 7, Jul. 2003.

Ref. 1.03: Title: Information Technology–Genetic Coding Moving Pictures and Associated Audio Information: Video. From: International Standard 13818–2 Recommendation ITU–T H.26. pp.: 1–224, (no date).

Ref 1.04: Title: Draft Text of Recommendation H.263 Version 2 ("H.263+") for Decision. From: International Telecommunicaiton Union. pp.: 1–143, 1997–2000 (no month).

Ref 1.05: Title: Information Technology–Coding of Audio Visual Objects–Part 2: Visual. From: International Organization for Standardization Organization International Normalization ISO/IEC JTC1/SC29/WG 11 Coding of Moving Picture and Audio. pp.: 1–526, Jul. 2001.

Reg 1.06: Title: DCT Coding for Motion Video Storage Using Adaptive Arithmetic Coding. Author: C.A. Gonzalez, L. Allman, T. McCarthy, P. Wendt. pp.: 145–154, 1990 (no month).

Ref 1.07: Title: Adaptive Codes for H.26L. From: ITU–Telecommunications Standardization Sector. pp.: 1–7, Jan. 9–12, 2001.

Ref. 1.08: Title: Further Results for CABAC Entropy Coding Scheme. From: ITU—Telecommunications Standardization Sector. pp.: 1–8, Apr. 2–9, 2001.

Ref 1.09: Title: Improved CABAC. From: Joint Video Team (JVT) of ISO/IEC MPEG & ITU–T VCEG (ISO/IEC JTC1/SC29/WG11 and ITU–T SG16 Q.6). pp.: 1–6, Jan. 29–Feb. 1, 2002.

Ref 1.10: Title: New Results in Improved CABAC. From: Joint Video Team (JVT) of ISO/IEC MPEG & ITU–T VCEG (ISO/IEC JTC1/SC29/WG11 and ITU–T SG16 Q.6). pp.: 1–12, Mar. 2002.

Ref 1.11: Title: Improved CABAC. From: ITU–Telecommunications Standardization Sector. pp.: 1–9, Dec. 4–6, 2001.

Ref 1.12: Title: Fast Arithmetic Coding for CABAC. From: Joint Video Team (JVT) of ISO/IEC MPEG & ITU–T VCEG (ISO/IEC JTC1/SC29/WG11 and ITU–T SG16 Q.6). pp.: 1–11, 1995 (no month).

Ref 1.13: Title: CABAC and Slices. From: Joint Video Team (JVT) of ISO/IEC MPEG & ITU–T VCEG (ISO/IEC JTC1/SC29/WG11 and ITU–T SG16 Q.6). pp.: 1–17, Jul. 2002.

Ref 1.14: Title: Analysis and Simplification of Intra Prediction. From: Joint Video Team (JVT) of ISO/IEC MPEG & ITU–T VCEG (ISO/IEC JTC1/SC29/WG11 and ITU–T SG16 Q.6), Jul. 2002.

Ref 1.15: Title: Proposed Cleanup Changes for CABAC. From: Joint Video Team (JVT) of ISO/IEC MPEG & ITU–T VCEG (ISO/IEC JTC1/SC29/WG11 and ITU–T SG16 Q.6). pp.: 1–7, Oct. 2002.

Ref 1.16: Title: CABAC Cleanup and Complexity Reduction. From: Joint Video Team (JVT) of ISO/IEC MPEG & ITU–T VCEG (ISO/IEC JTC1/SC29/WG11 and ITU–T SG16 Q.6). pp.: 1–20, Oct. 2002.

Ref 1.17: Title: Final CABAC Cleanup. From: Joint Video Team (JVT) of ISO/IEC MPEG & ITU–T VCEG (ISO/IEC JTC1/SC29/WG11 and ITU–T SG16 Q.6). pp.: 1–24, Dec. 2002.

Ref 1.18: Title: Very Low Bit–Rate Video Coding Using Wavelet–Based Techniques. Author: Detlev Marpe and Hans L. Cycon, vol. 9, No. 1, Feb. 1999, pp.: 85–94.

Ref 1.19: Title: Wavelet–Based Very Low Bit–Rate Video Coding Using Image Warping and Overlapped Block Motion Compensation. Author: G. Heising, D. Marpe, H.L. Cycon and A.P. Petukhov. pp.: 93–101, Apr. 2001.

Ref 1.20: Title: Motion–Compensated 3–D Subband Coding of Video. Author: Seung–Jong Choi and John W. Woods, Fellow IEEE. pp.: 155–167, vol. 8, No. 2, Feb. 1999.

Ref 1.21: Title: A New Fast and Efficient Image Codec Based on Set Partitioning in Hierarchical Trees*. Author: Amir Said (Faculty of Electrical Engineering) and William A. Pearlman (Department of Electrical, Computer, and Systems Engineering Renesselar Polytechnic Institute). pp.: 1–15, May 1993.

Ref 1.22: Title: Efficient Pre–Coding Techniques for Wavelet–Based Image Compression. Author: Detlev Marpe & Hans L. Cycon. pp.: 45–51, (no date).

Ref 1.23: Title: Universal Modeling and Coding. Author: Jorma Rissanen and Glen G. Langdon, Jr., Senior Member, IEEE. pp.: 12–23, vol. 27, No. 1, Jan. 1981.

Ref 1.24: Title: Universal Coding Information, Prediction, and Estimation. Author: Jorma Rissanen, vol. 30, No. 4, Jul. 1984, pp.: 629–636.

Ref 1.27: Title: Applications of Universal Context Modeling to Lossless Compression of Grey–Scale Images. Author: Marcelo J. Weinberger, Member, IEEE, Jorma J. Rissanen, Senior Member, IEEE, and Ronald B. Arps. pp.: 575–586, vol. 5, No. 4, Apr. 1996.

Ref 1.29: Title: A Compression Method for Clustered Bit–Vectors. Author: Jukka Teuhola (Department of Computer Science, University of Turka). Application: XP–001000934, Oct. 1978.

Ref 1.30: Title: Optimal Source Codes for Geometrically Distributed Integer Alphabets. Author: Robert G. Gallager, fellow, IEEE, David C. Vanvoorhis, member, IEEE. pp.: 228–230, Mar. 1975.

Ref 1.32: Title: An Overview of the Basic Principles of the Q–Coder Adaptive Binary Arithmetic Coder. Author: W.B. Pennebaker, J.L. Mitchell, G.G. Langdon, Jr., and R.B. Arps, vol. 32, No. 6, Nov. 1988, pp.: 717–726.

Ref 1.31: Title: A Context Modeling Algorithm and its Application in Video Compression. Author: Marta Mrak, Detlev Marpe, and Thomas Wiegand, (no date).

Ref 1.33: Title: A Multiplication–Free Multialphabet Arithmetic Code. Author: Jorma Rissanen and K.M. Mohiuddin, vol. 37, No. 2, pp.: 93–98, Feb. 1989.

Ref 1.34: Title: Practical Implementations of Arithmetic Code. Author: Paul G. Howard and Jeffrey Scott Vitter. pp.: 1–30, Oct. 16–18, 1991.

Ref 1.35: Title: Sample Data Coding. From: Chapter 12. pp.: 474–484, (no date).

Ref 1.37: Title: Arithmetic Code Revisited. Author: Alistair Moffat (The University of Melbourne), Radford M. Neal (University of Toronto), and Ian H. Witten (zthe University of Waikato), vol. 16, No. 3, Jul. 1998, pp.: 257–294.

Ref 1.38: Title: Rate–Constrained Coder Control and Comparison of Video Coding Standards. Author: IEEE Transactions on Circuits and Systems for Video Technology, vol. 13, No. 7, Jul. 2003. Thomas Wiegand, Heiko Schwartz, Anthony Joch, Faouzi Kossentini, Senior Members, IEEE, and Gary J. Sullivan, Senior Member, IEEE, vol. 13, No. 7, Jul. 2003, pp.: 689–703.

Ref 2.1: Title: Draft ITU–T Recommendation and Final Draft International Standard of Joint Video Specification (ITU–T rec. H.264 I ISO/IEC 14496–10 AVC). From: Joint Video Team (JVT) of SO/IEC MPEG & ITU–T VCEG (ISO/IEC JTC1/SC29/WG11 and ITU–T SG 16 Q/6). pp. 1–249, Mar. 7–14, 2003.

Ref 2.03x: Title: Line Transmission of Non–Telephone Signals / Video Codec for Audiovisual Services AT p × 64 kbit/s. From: International Telecommunication Union H.261. pp.: 1–25, Jun. 1994.

Ref 2.06x: Title: H.264/AVC Over IP. From: Stephan Wenger. pp.: 645–656, vol. 13, No. 7, Jul. 2003.

Ref 2.07: Title: H.264/AVC in Wireless Environments. Author: Thomas Stockhammer, Miska M. Hannuksela, and Thomas Wiegand. pp.: 657–673, vol. 13, No. 7, Jul. 2003.

Ref 2.08: Title: Motion–and Aliasing–Compensated Prediction for Hybrid Video Coding. Author: Thomas Wedi and Hand Georg Musmann. pp.: 577–586, vol. 13, No. 7, Jul. 2003.

Ref 2.9: Title: Long–Term Memory Motion–Compensated Prediction. Author: Thomas Wiegand, Xiaozheng Zhang, and Bernd Girod, Fellow, IEEE. pp.: 70–84, vol. 9, No. 1, Feb. 1999.

Ref 2.11: Title: A Locally Optimal Design Algorithm for Block–Based Multi–Hypothesis Motion–Compensated Prediction. Author: Markus Flierl, Thomas Wiegand, and Bernd Girod Telecommunications Laboratory University of Erlangen–Nürnberg, Germany. pp.: 1–10, Mar. 1998.

Ref 2.12: Title: Generalized B Pictures and the Draft H.264/AVC Video–Compression Standard. Author: Markus Fierl, Student Member, IEEE, and Bernd Girod, Fellow, IEEE. pp.: 587–597, vol. 13, No. 7, Jul. 2003.

Ref 2.13: Title: Rate–Constrained Coder Control and Compression of Video Coding Standards. From: Thomas Wiegand, Heiko Schwarz, Anthony Joch, Faouzi Kossentini, Senior Member, IEEE, and Gary J. Sullivan, Senior Member, IEEE. pp.: 688–703, vol. 13, No. 7, Jul. 2003.

Ref 2.14: Title: H.264/AVC Over IP. Author: Stephan Wenger. pp.: 645–656, vol. 13, No. 7, Jul. 2003.

Ref 2.15: Title: The SP–and Si–Frames Design for H.264/AVC. Author: Marta Karcewicz and Ragip Kurceren, Member, IEEE. pp.: 637–644, vol. 13, No. 7, Jul. 2003.

Ref 2.16: Title: Context–Based Adaptive Binary Arithmetic Coding in the H/264/AVC Video Compression Standard. Author: Detlev Marpe, Member, IEEE, Heiko Sczwarz, and Thomas Wiegand. pp.: 620–636, vol. 13, No. 7, Jul. 2003.

Ref 2.17: Title: Low–Complexity Transform and Quantization in H.264/AVC. From: Henrique S. Malvar, Fellow, IEEE, Antti Hallapuro, Marta Karczewicz, and Louis Kerofsky, Member, IEEE. pp.: 598–603, vol. 13, No. 7, Jul. 2003.

Ref 2.18: Title: Adaptive Deblocking Filter. Author: Peter List, Anthony Joch, Jani Lainema, Gisle Bjontegaard, and Marta Karczewicz. pp.: 614–619, vol. 13, No. 7, Jul. 2003.

Ref 2.19: Title: A Generlized Hypothetical Reference Decoder for H.264/AVC. Author: Jordi Ribas–Cobrera, Member, IEEE, Philip A. Chou, Senior Member, IEEE, and Shankar L. Regunathan. pp.: 674–687, vol. 13, No. 7, Jul. 2003.

Ref A: Title: Draft ITU–T Recommendation and Final Draft International Standard of Joint Video Specification (ITU–T Rec. zh.264 I ISO/IEC 14496–10 AVC). From: Joint Video Team (JVT) of ISO/IEC MPEG & ITU–T VCEG (ISO.IEC JTC1/SC29/WG11 and ITU–T SG16 Q.6). pp.: 1–253, May 23–27, 2003.

Ref B: Title: A Highly Efficient Multiplication–Free Binary Arithmetic Coder and its Application in Video Coding. Author: Detlev Marpe and Thomas Wiegand. pp.: 1–4, Sep. 14–17, 2003.

Ref C: Title: Proposed Editorial Changes and Cleanup of CABAC. From: Joint Video Team (JVT) of ISO/IEC MPEG & ITU–T VCEG (ISO.IEC JTC1/SC29/WG11 and ITU–T SG16 Q.6). pp.: 1–10, Jul. 22–26, 2002.

Ref D: Title: Study of Final Committee Draft of Joint Video Specification (ITU–T Rec. H.264 I ISO/IEC 14496–10 AVC). From: Joint Video Team (JVT) of ISO/IEC MPEG & ITU–T VCEG (ISO.IEC JTC1/SC29/WG11 and ITU–T SG16 Q.6). pp.: 1–239, Dec. 5–13, 2003.

Ref E: Title: Study of Final Committee Draft and Joint Video Specification (ITU–T Rec. H.264 I ISO/IEC 14496–10 AVC). From: Joint Video Team (JVT) of ISO/IEC MPEG & ITU–T VCEG (ISO.IEC JTC1/SC29/WG11 and ITU–T SG16 Q.6). pp.: 1–227, Dec. 5–13, 2002.

Ref F: Title: CABAC and Slices. From: Joint Video Team (JVT) of ISO/IEC MPEG & ITU–T VCEG (ISO.IEC JTC1/SC29/WG11 and ITU–T SG16 Q.6). pp.: 1–17, Jul. 22–26, 2002.

* cited by examiner

```
1. Determination of the LPS
2. Calculation of the Variables R_LPS and R_MPS :
      R_LPS = R x P_LPS
      R_MPS = R - R_LPS
3. Calculation of the new partial interval:
      if (bit = LPS) then
            L ← L + R_MPS
            R ← R_LPS
      else
            R ← R_MPS
4. Updating the probability estimation P_LPS
5. Outputting the bits and renormalizing R
```

FIG. 1

```
1. Determination of the LPS
2. Quantization of R:
      q_index = Qtab[R>>q]
3. Determination of R_LPS and R_MPS :
      R_LPS = Rtab[q_index,p_state]
      R_MPS = R - R_LPS
4. Calculation of the new partial interval:
      if (bit = LPS) then
            L ← L + R_MPS
            R ← R_LPS
            p_state ← Next_State_LPS[p_state]
      else
            R ← R_MPS
            p_state ← Next_State_MPS[p_state]
```

FIG. 2

1. Determination of the LPS
2. Quantization of R:
   q_index = Qtab[R>>q]
3. Determination of $R_{LPS}$ and $R_{MPS}$:
   $R_{LPS}$ = Rtab[q_index,p_state]
   $R_{MPS}$ = R - $R_{LPS}$
4. Determination of bit, depending on the position of the partial interval:
   if (V ≥ $R_{MPS}$) then
       bit ← LPS
       V ← V - $R_{MPS}$
       R ← $R_{LPS}$
       p_state ← Next_State_LPS[p_state]
   else
       bit ← MPS
       R ← $R_{MPS}$
       p_state ← Next_State_MPS[p_state]
5. Renormalization of R, reading out a bit and updating V

FIG. 3

Encoder:

1. Calculating the new partial interval:
   ```
   R ← R >> 1
   if (bit = 1) then
       L ← L + R
   ```
2. Outputting bits and renormalizing R Decoder:

1. Determination of bit, depending on the position of the partial interval:
   ```
   if (V ≥ R) then
       bit ← 1
       V ← V - R
   else
       bit ← 0
   ```
2. Reading out a bit, renormalizing R and updating V

FIG. 4

```
Encoder:

1. Calculating the new partial interval:
        L ← L << 1
        if (bit = 1) then
            L ← L + R 2. Outputting a bit and renormalizing using doubled determination threshold values
       (without doubling R and L)

Decoder:

1. Reading out a bit and updating V
    2. Determination of bit depending on the position
       of the partial interval:
        if (V ≥ R) then
            bit ← 1
            V ← V - R
        else
            bit ← 0
```

Fig. 5

```
    1. preState = min(max(. 1, ((m * SliceQP )>>4)+n),126)
    2. if (preState <= 63) then
            p_state = 63 - preState
            valMPS = 0
       else
            p_state = preState - 64
            valMPS = 1
```

Fig. 6

METHOD AND ARRANGEMENT FOR ARITHMETIC ENCODING AND DECODING BINARY STATES AND A CORRESPONDING COMPUTER PROGRAM AND A CORRESPONDING COMPUTER-READABLE STORAGE MEDIUM

CROSS-REFERENCE TO RELATED APPLICATION

This application is a continuation of copending International Application No. PCT/EP03/04654, filed May 2, 2003, which designated the United States and was not published in English.

BACKGROUND OF THE INVENTION

1. Field of the Invention

The invention relates to a method and an arrangement for arithmetically encoding and decoding binary states and to a corresponding computer program and a corresponding computer-readable storage medium which may in particular be used in digital data compression.

2. Description of the Related Art

The present invention describes a new efficient method for binary arithmetic coding. There is a demand for binary arithmetic coding in most different application areas of digital data compression; here, in particular applications in the fields of digital image compression are of special interest. In numerous standards for image coding, like e.g. JPEG, JPEG-2000, JPEG-LS and JPIG, methods for a binary arithmetic coding were defined. Newer standardization activities make also the future use of such coding technologies obvious in the field of video coding (CABAC in H.264/AVC) [1].

The advantages of arithmetic coding (AC) in contrast to the Huffman coding [2] which has up to now been used in practice, may basically be characterized by three features:

1. By using the arithmetic coding, by simple adaptation mechanisms a dynamic adaptation to the present source statistic may be obtained (adaptivity).
2. Arithmetic coding allows the allocation of a non-integer number of bits per symbol to be coded and is therefore suitable to achieve coding results which illustrate an approximation of the entropy as the theoretically given lower bound (entropy approximation) [3].
3. Using suitable context models statistical bindings between symbols for a further data reduction may be used with arithmetic coding (intersymbol redundancy) [4].

As a disadvantage of an application of the arithmetic coding, generally the increased calculation effort compared to Huffman coding is regarded.

The concept of the arithmetic coding goes back to the basic documentation for information theory by Shannon [5]. First conceptional construction methods were firstly published by Elias [6]. A first LIFO (last-in-first-out) variant of the arithmetic coding was designed by Rissanen [7] and later modified [8] [9] [10] by different authors to the FIFO implementations (first-in-first-out).

All of those documents have the basic principle of recursive partial interval decomposition in common. Corresponding to the given probabilities P("0") and P("1") of two results {"0", "1"} of a binary alphabet a primarily given interval, e.g. the interval [0, 1), is recursively decomposed into partial intervals depending on the occurrence of individual events. Here, the size of the resulting partial interval as the product of the individual probabilities of the occurring events is proportional to the probability of the sequence of individual events. As every event $S_i$ adds a contribution of $H(S_i)=-\log(P(S_i))$ of the theoretical information content $H(S_i)$ of $S_i$ to the overall rate by the probability $P(S_i)$, a relation between the number $N_{Bit}$ of bits for illustrating the partial interval and the entropy of the sequence of individual events results, which is given by the right side of the following equation:

$$N_{Bit}=-\log \Pi_i P(Si)=-\Sigma_i \log P(Si)$$

The basic principle, however, first of all requires a (theoretically) unlimited accuracy in the illustration of the resulting partial interval and apart from that it has the disadvantage that only after the coding of the last result may the bits for a representation of the resulting partial interval be output. For practical application purposes it was therefore decisive to develop mechanisms for an incremental output of bits with a simultaneous representation with numbers of a predetermined fixed accuracy. These were first introduced in the documents [3] [7] [11].

In FIG. 1, the basic operations for a binary arithmetic coding are indicated. In the illustrated implementation the current partial interval is represented by the two values L and R, wherein L indicates the offset point and R the size (width) of the partial interval, wherein both quantities are respectively illustrated using b-bit integers. The coding of a bit $\in\{0, 1\}$ is thereby basically performed in five substeps: In the first step using the probability estimation the value of the less probable symbol is determined. For this symbol, also referred to as LPS (least probable symbol), in contrast to the MPS (most probable symbol), the probability estimation $P_{LPS}$ is used in the second step for calculating the width $R_{LPS}$ of the corresponding partial interval. Depending on the value of the bit to be coded L and R are updated in the third step. In the forth step the probability estimation is updated depending on the value of the just coded bit and finally the code interval R is subjected to a so-called renormalization in the last step, i.e. R is for example rescaled so that the condition $R\in[2^{b-2}, 2^{b-1}]$ is fulfilled. Here, one bit is output with every scaling operation. For further details please refer to [10].

The main disadvantage of an implementation, as outlined above, now lies in the fact that the calculation of the interval width $R_{LPS}$ requires a multiplication for every symbol to be coded. Generally, multiplication operations, in particular when they are realized in hardware, are cost- and time-intensive. In several research documents methods were examined to replace this multiplication operation by a suitable approximation [11] [12] [13] [14]. Hereby, the methods published with reference to this topic may generally be separated into three categories.

The first group of proposals for a multiplication-free, binary arithmetic coding is based on the approach to approximate the estimated probabilities $P_{LPS}$ so that the multiplication in the second step of FIG. 1 may be replaced by one (or several) shift and addition operation(s) [11] [14]. For this, in the simplest case the probabilities $P_{LPS}$ are approximated by values in the form of $2^{-q}$ with the integer q>0.

In the second category of approximative methods it is proposed to approximate the value range of R by discrete values in the form of (½−r), wherein $r \in\{0\}\cup\{2^{-k}|k>0,$ k integer$\}$ is selected [15] [16].

The third category of methods is only known from the fact that here any arithmetic operations are replaced by table accesses. To this group of methods on the one hand the Q-coder used in the JPEG standard and related methods, such as the QM- and MQ-coder [12], and on the other hand the quasi-arithmetic coder [13] belong. While the latter method performs a drastic limitation of the number b of bits used for the representation of R in order to obtain acceptably dimensioned tables, in the Q-coder the renormalization of R is implemented so that R may at least approximately be approximated by 1. This way the multiplication for determining $R_{LPS}$ is prevented. Additionally, the probability estimation using a table in the form of a finite state machine is operated. For further details please see [12].

SUMMARY OF THE INVENTION

It is the object of the present invention to provide a method and an arrangement for an arithmetic encoding and decoding of binary states and a corresponding computer program and a corresponding computer-readable storage medium which eliminate the mentioned disadvantages and in particular (a) do not require a multiplication, (b) allow a probability estimation without calculation effort and (c) simultaneously guarantee a maximum coding efficiency over a wide range of typically occurring symbol probabilities.

In accordance with a first aspect, the present invention provides a method for an arithmetic encoding and decoding of binary states, wherein in a first step a presetable value range for the specification of the interval width R is separated in K representative interval widths $\{Q_1, \ldots, Q_K\}$, a presetable value range for the specification of the probabilities is separated in N representative probability states $\{P_1, \ldots, P_N\}$ and allocation regulations are given, which allocate one $Q_K$ ($1 \leq k \leq K$) to every interval width R and one $P_n$ ($1 \leq n \leq N$) to every probability, and that in a second step the encoding or decoding of the binary states take place by performing the calculation of the new interval width to be derived in the encoding or decoding process, respectively, using a representative interval width $Q_K$ ($1 \leq k \leq K$) and a representative probability state $P_n$ ($1 \leq n \leq N$) by arithmetic operations other than multiplication and division, wherein the representative interval width $Q_K$ is determined by the basic basis interval of the width R and the representative probability state $P_n$ is determined by the probability estimation underlying the symbol to be encoded or to be decoded according to the given allocation regulations.

In accordance with a second aspect, the present invention provides an arrangement having at least one processor and/or chip, which is/are implemented such that a method for an arithmetic encoding and decoding of binary states is may be performed, wherein in a first step a presetable value range for the specification of the interval width R is separated in K representative interval widths $\{Q_1, \ldots, Q_K\}$, a presetable value range for the specification of the probabilities is separated in N representative probability states $\{P_1, \ldots, P_N\}$ and allocation regulations are given, which allocate one $Q_K$ ($1 \leq k \leq K$) to every interval width R and one $P_n$ ($1 \leq n \leq N$) to every probability, and wherein in a second step the encoding or decoding of the binary states take place by performing the calculation of the new interval width to be derived in the encoding or decoding process, respectively, using a representative interval width $Q_K$ ($1 \leq k \leq K$) and a representative probability state $P_n$ ($1 \leq n \leq N$) by arithmetic operations other than multiplication and division, wherein the representative interval width $Q_K$ is determined by the basic basis interval of the width R and the representative probability state $P_n$ is determined by the probability estimation underlying the symbol to be encoded or to be decoded according to the given allocation regulations.

In accordance with a third aspect, the present invention provides a computer program which enables a computer after it has been loaded into the storage of the computer to perform a method for an arithmetic encoding and decoding of binary states, wherein in a first step a presetable value range for the specification of the interval width R is separated in K representative interval widths $\{Q_1, \ldots, Q_K\}$, a presetable value range for the specification of the probabilities is separated in N representative probability states $\{P_1, \ldots, P_N\}$ and allocation regulations are given, which allocate one $Q_K$ ($1 \leq k \leq K$) to every interval width R and one $P_n$ ($1 \leq n \leq N$) to every probability, and wherein in a second step the encoding or decoding of the binary states take place by performing the calculation of the new interval width to be derived in the encoding or decoding process, respectively, using a representative interval width $Q_K$ ($1 \leq k \leq K$) and a representative probability state $P_n$ ($1 \leq n \leq N$) by arithmetic operations other than multiplication and division, wherein the representative interval width $Q_K$ is determined by the basic basis interval of the width R and the representative probability state $P_n$ is determined by the probability estimation underlying the symbol to be encoded or to be decoded according to the given allocation regulations.

In accordance with a fourth aspect, the present invention provides A computer-readable storage medium on which a computer program is stored which enables a computer after it has been loaded into the storage of the computer to perform a method for an arithmetic encoding and decoding of binary states, wherein in a first step a presetable value range for the specification of the interval width R is separated in K representative interval widths $\{Q_1, \ldots, Q_K\}$, a presetable value range for the specification of the probabilities is separated in N representative probability states $\{P_1, \ldots, P_N\}$ and allocation regulations are given, which allocate one $Q_K$ ($1 \leq k \leq K$) to every interval width R and one $P_n$ ($1 \leq n \leq N$) to every probability, and wherein in a second step the encoding or decoding of the binary states take place by performing the calculation of the new interval width to be derived in the encoding or decoding process, respectively, using a representative interval width $Q_K$ ($1 \leq k \leq K$) and a representative probability state $P_n$ ($1 \leq n \leq N$) by arithmetic operations other than multiplication and division, wherein the representative interval width $Q_K$ is determined by the basic basis interval of the width R and the representative probability state $P_n$ is determined by the probability estimation underlying the symbol to be encoded or to be decoded according to the given allocation regulations.

One method for an arithmetic encoding and decoding of binary states is advantageously performed so that in a first step a presetable value range for the specification of the interval width R is separated in K representative interval widths $\{Q_1, \ldots, Q_K\}$, a presetable value range for the specification of the probabilities is separated in N representative probability states $\{P_1, \ldots, P_N\}$ and allocation regulations are given, which allocate one $Q_K$ ($1 \leq k \leq K$) to every interval width R and one $P_n$ ($1 \leq n \leq N$) to every probability, and that in a second step the encoding or decoding of the binary states take place by performing the calculation of the new interval width to be derived in the encoding or decoding process, respectively, using a representative interval width $Q_K$ ($1 \leq k \leq K$) and a representative probability state $P_n$ ($1 \leq n \leq N$) by arithmetic operations other than multiplication and division, wherein the representative interval width $Q_K$ is determined by the basic basis interval of the width R and the representative probability state $P_n$ is determined by the probability estimation underlying the symbol to be encoded or to be decoded according to the given allocation regulations.

Another preferred implementation of the invention is characterized by the fact that based on the interval currently to be evaluated with a width R for determining the associated interval width $Q_K$ an index q_index is determined by a shift and bit masking operation applied to the computer-internal/binary representation of R.

It is also advantageous when based on the interval currently to be evaluated with a width R for determining the associated interval width $Q_K$ an index q_index is determined by a shift operation applied to the computer-internal/binary representation of R and a downstream access to a table Qtab, wherein the table Qtab contains the indices of interval widths which correspond to the values of R which were pre-quantized by the shift operation.

It is in particular advantageous when the probability estimation underlying the symbol to be encoded or decoded is associated to a probability state $P_n$ using an index p_state.

It is also an advantage when the determination of the interval width $R_{LPS}$ corresponding to the LPS is performed by an access to the table Rtab, wherein the table Rtab contains the values corresponding to all K quantized values of R and to the N different probability states of the interval width $R_{LPS}$ as product values $(Q_K * P_n)$. The calculation effort is reduced in particular when the determination of the interval width $R_{LPS}$ corresponding to the LPS is performed by an access to the table Rtab, wherein for evaluating the table the quantization index q_index and the index of the probability state p_state are used.

It is further provided that in the inventive method for the N different representative probability states transition rules are given, wherein the transition rules indicate which new state is used based on the currently encoded or decoded symbol for the next symbol to be encoded or decoded. It is hereby of an advantage when a table Next_State_LPS is created which contains the index m of the new probability state $P_m$ when a least probable symbol (LPS) occurs in addition to the index n of the currently given probability state $P_n$, and/or when a table Next_State_MPS is created which contains the index m of the new probability state $P_m$ when a most probable symbol (MPS) occurs in addition to the index n of the currently given probability state $P_n$.

An optimization of the method for a table-aided binary arithmetic encoding and decoding is achieved in particular by the fact that the values of the interval width $R_{LPS}$ corresponding to all K interval widths and to all N different probability states are filed as product values $(Q_K * P_n)$ in a table Rtab.

A further optimization is achieved when the number K of the quantization values and/or the number N of the representative states are selected depending on the preset accuracy of the coding and/or depending on the available storage room.

One special implementation of the encoding in the inventive method includes the following steps:
1. Determination of the LPS
2. Quantization of R:

$$q\_index = Qtab[R>>q]$$

3. Determination of $R_{LPS}$ and R:

$$R_{LPS} = Rtab[q\_index, p\_state]$$

$$R = R - R_{LPS}$$

4. Calculation of the new partial interval:

```
if (bit : LPS) then
    L ← L + R
    R ← R_LPS
    p_state ← Next_State_LPS [p_state]
    if (p_state = 0) then valMPS ← 1 - valMPS
else
    p_state ← Next_State_MPS [p_state]
```

5. Renormalization of L and R, writing bits, wherein

| | |
|---|---|
| q_index | describes the index of a quantization value read out of Qtab, |
| p_state | describes the current state, |
| $R_{LPS}$ | describes the interval width corresponding to the LPS and |
| valMPS | describes the bit corresponding to the MPS. |

The decoding in a special implementation of the inventive method includes the following steps:
1. Determination of the LPS
2. Quantization of R:

$$q\_index = Qtab[R>>q]$$

3. Determination of $R_{LPS}$ and R:

$$R_{LPS} = Rtab[q\_index, p\_state]$$

$$R = R - R_{LPS}$$

4. Determination of bit depending on the position of the partial interval:

```
if (V ≥ R) then
    bit ← LPS
    V ← V - R
    R ← R_LPS
        if (p_state = 0) valMPS ← 1 - valMPS
        p_state ← Next_State_LPS [p_state]
else
    bit ← MPS
    p_state ← Next_State_MPS [p_state]
```

5. Renormalization of R, reading out one bit and updating V, wherein

| | |
|---|---|
| q_index | describes the index of a quantization value read out of Qtab, |
| p_state | describes the current state, |
| $R_{LPS}$ | describes the interval width corresponding to the LPS, |
| valMPS | describes the bit corresponding to the MPS, and |
| V | describes a value from the interior of the current partial interval. |

In another special implementation of the inventive method it is provided that in encoding and/or decoding the calculation of the quantization index q_index is performed in the second substep after the calculation regulation:

$$q\_index = (R>>q) \ \& \ Qmask$$

wherein Qmask illustrates a bit mask suitably selected depending on K.

If a uniform probability distribution is present a further optimization of the method for a table-aided binary arithmetic encoding and decoding may be achieved by the fact that in the encoding according to claim 12 the substeps 1 to 4 are performed according to the following calculation regulation:

$$R \leftarrow R >> 1$$
$$\text{if (bit = 1) then}$$
$$L \leftarrow L + R$$

or that the substeps 1 to 4 of the encoding according to claim 12 are performed according to the following calculation regulation:

$$L \leftarrow R >> 1$$
$$\text{if (bit = 1) then}$$
$$L \leftarrow L + R$$

and wherein in the last alternative the renormalization (substep 5 according to claim 12) is performed with doubled decision threshold values and no doubling of L and R is performed, and that in the decoding according to claim 13 the substeps 1 to 4 are performed according to the following calculation regulation:

$$R \leftarrow R >> 1$$
$$\text{if } (V \geq R) \text{ then}$$
$$\text{bit} \leftarrow 1$$
$$V \leftarrow V - R$$
$$\text{else}$$
$$\text{bit} \leftarrow 0,$$

or the substeps 1 to 5 of the decoding according to claim 13 are performed according to the following calculation regulation:

1. Reading out one bit and updating V
2. Determination of bit according to the position of the partial interval:

$$\text{if } (V \geq R) \text{ then}$$
$$\text{bit} \leftarrow 1$$
$$V \leftarrow V - R$$
$$\text{else}$$
$$\text{bit} \leftarrow 0.$$

It further turns out to be advantageous when the initialization of the probability models is performed depending on a quantization parameter SliceQP and preset model parameters m and n, wherein SliceQP describes the quantization parameter preset at the beginning of a slice and m and n describe the model parameters.

It is also advantageous when the initialization of the probability models includes the following steps:

1. preState=min(max(1, ((m*SliceQP)>>4)+n), 2*N)

```
2. if (preState <=N) then
      p_state = N+1 - preState
      valMPS = 0
   else
      p_state = preState - N
      valMPS = 1,
``` wherein valMPS describes the bit corresponding to the MPS, SliceQP describes the quantization parameter preset at the beginning of a slice and m and n describe the model parameters.

One arrangement for an arithmetic encoding and decoding of binary states includes at least one processor which is/are implemented such that a method for an arithmetic encoding and decoding may be performed, wherein in a first step a presetable value range for the specification of the interval width R is separated in K representative interval widths $\{Q_1, \ldots, Q_K\}$, a presetable value range for the specification of the probabilities is separated in N representative probability states $\{P_1, \ldots, P_N\}$ and allocation regulations are given, which allocate one $Q_K$ ($1 \leq k \leq K$) to every interval width R and one $P_n$ ($1 \leq n \leq N$) to every probability, and wherein in a second step the encoding or decoding of the binary states take place by performing the calculation of the new interval width to be derived in the encoding or decoding process, respectively, using a representative interval width $Q_K$ ($1 \leq k \leq K$) and a representative probability state $P_n$ ($1 \leq n \leq N$) by arithmetic operations other than multiplication and division, wherein the representative interval width $Q_K$ is determined by the basic basis interval of the width R and the representative probability state $P_n$ is determined by the probability estimation underlying the symbol to be encoded or to be decoded according to the given allocation regulations.

One computer program for an arithmetic encoding and decoding of binary states allows a computer, after it has been loaded into the storage of the computer, to perform an method for an arithmetic encoding and decoding, wherein in a first step a presetable value range for the specification of the interval width R is separated in K representative interval widths $\{Q_1, \ldots, Q_K\}$, a presetable value range for the specification of the probabilities is separated in N representative probability states $\{P_1, \ldots, P_N\}$ and allocation regulations are given, which allocate one $Q_K$ ($1 \leq k \leq K$) to every interval width R and one $P_n$ ($1 \leq n \leq N$) to every probability, and wherein in a second step the encoding or decoding of the binary states take place by performing the calculation of the new interval width to be derived in the encoding or decoding process, respectively, using a representative interval width $Q_K$ ($1 \leq k \leq K$) and a representative probability state $P_n$ ($1 \leq n \leq N$) by arithmetic operations other than multiplication and division, wherein the representative interval width $Q_K$ is determined by the basic basis interval of the width R and the representative probability state $P_n$ is determined by the probability estimation underlying for the symbol to be encoded or to be decoded according to the given allocation regulations.

For example, such computer programs may be provided (against a certain fee or for free, freely accessible or password-protected) which may be downloaded into a data or communication network. The thus provided computer programs may then be made useable by a method in which a computer program according to claim 22 is downloaded from a network for data transmission, like for example from the internet to a data processing means connected to the network.

For performing a method for an arithmetic encoding and decoding of binary states preferably a computer-readable storage medium is used on which a program is stored which allows a computer, after it has been loaded into the storage of the computer, to perform a method for an arithmetic encoding or decoding, wherein in a first step a presetable value range for the specification of the interval width R is separated in K representative interval widths $\{Q_1, \ldots, Q_K\}$, a presetable value range for the specification of the probabilities is separated in N representative probability states $\{P_1, \ldots, P_N\}$ and allocation regulations are given, which allocate one $Q_K$ ($1 \leq k \leq K$) to every interval width R and one $P_n$ ($1 \leq n \leq N$) to every probability, and wherein in a second step the encoding or decoding of the binary states take place by performing the calculation of the new interval width to be derived in the encoding or decoding process, respectively, using a representative interval width $Q_K$ ($1 \leq k \leq K$) and a representative probability state $P_n$ ($1 \leq n \leq N$) by arithmetic operations other than multiplication and division, wherein the representative interval width $Q_K$ is determined by the basic basis interval of the width R and the representative probability state $P_n$ is determined by the probability estimation underlying as the basis for the symbol to be encoded or to be decoded according to the given allocation regulations.

The new method is distinguished by the combination of three features. First of all, similar to the Q-coder the probability estimation is performed using a finite state machine (FSM), wherein the generation of the N-representative states of the FSM is performed offline. The corresponding transition rules are thereby filed in the form of tables.

A second characteristic feature of the invention is a prequantization of the interval width R to a number of K predefined quantization values. This allows, with a suitable dimensioning of K an N, the generation of a table which contains all K×N combinations of precalculated product values $R \times P_{LPS}$ for a multiplication-free determination of $R_{LPS}$.

For the use of the presented invention in an environment in which different context models are used among which also such with (almost) uniform probability distribution are located, as an additional (optional) element a separated branch is provided within the coding machine in which assuming an equal distribution the determination of the variables L and R and the renormalization regarding the calculation effort is again substantially reduced.

As a whole the invention in particular provides the advantage that it allows a good compromise between a high coding efficiency on the one hand and a low calculating effort on the other hand.

BRIEF DESCRIPTION OF THE DRAWINGS

These and other objects and features of the present invention will become clear from the following description taken in conjunction with the accompanying drawings, in which:

FIG. 1 shows an illustration of the basic operations for a binary arithmetic coding;

FIG. 2 shows a modified scheme for a table-aided arithmetic encoding;

FIG. 3 shows the principle of the table-aided arithmetic decoding;

FIG. 4 shows the principle of encoding or decoding, respectively, binary data having a uniform distribution;

FIG. 5 shows an alternative realization of encoding or decoding, respectively, for binary data with a uniform distribution; and FIG. 6 shows the initialization of the probability models depending on a quantization parameter SliceQP and preset model parameters m and n.

DESCRIPTION OF THE PREFERRED EMBODIMENTS

First of all, however, the theoretical background is to be explained in more detail:

Table-Aided Probability Estimation

As it was already mentioned above, the effect of the arithmetic coding relies on an estimation of the occurrence probability of the symbols to be coded which is to be as good as possible. In order to enable an adaptation to non-stationary source statistics, this estimation needs to be updated in the course of the coding process. Generally, usually methods are used for this which operate using scaled frequency counters of the coded results [17]. If $C_{LPS}$ and $C_{MPS}$ designates counters for the occurrence frequencies of LPS and MPS, then using these counters the estimation $$P_{LPS} = \frac{C_{LPS}}{C_{LPS} + C_{MPS}} \quad (1)$$

may be performed and then the operation outlined in FIG. 1 of the interval separation may be carried out. For practical purposes the division required in equation (1) is disadvantageous. It is often convenient and required, however, to perform a resealing of the counter readings when a predetermined threshold value $C_{max}$ of the overall counter $C_{Total} = C_{MPS} + C_{LPS}$ is exceeded. (In this context it is to be noted that with a b-bit representation of L and R the smallest probability which may be indicated correctly is $2^{-b+2}$, so that for preventing that this lower limit is fallen short of, if necessary a resealing of the counter readings is required.) With a suitable selection of $C_{max}$ the reciprocal values of $C_{Total}$ may be tabulated, so that the division required in equation (1) may be replaced by a table access and by a multiplication and shift operation. In order to prevent also these arithmetic operations, however, in the present invention a completely table-aided method is used for the probability estimation.

For this purpose in a training phase representative probability states $\{P_K | 0 \leq k < N_{max}\}$ are preselected, wherein the selection of the states is on the one hand dependent on the statistics of the data to be coded and on the other hand on the side conditions of the default maximum number $N_{max}$ of states. Additionally, transition rules are defined which indicate which new state is to be used for the next symbol to be coded based on the currently coded symbol. These transition rules are provided in the form of two tables: $\{Next\_State\_LPS_k | 0 \leq k < N_{max}\}$ and $\{Next\_State\_MPS_k | 0 \leq k < N_{max}\}$, wherein the tables provide the index m of the new probability state $P_m$ when an LPS or MPS occurs, respectively, for the index n of the currently given probability state. It is to be noted here, that for a probability estimation in the arithmetic encoder or decoder, respectively, as it is proposed herein, no explicit tabulation of the probability states is required. Rather, the states are only implicitly addressed using their respective indices, as it is described in the following section. In addition to the transition rules it needs to be specified at which probability states the value of the LPS and MPS needs to be exchanged. Generally, there will only be one such excellent state which may be identified using its index p_state.

Table-Aided Interval Separation

FIG. 2 shows the modified scheme for a table-aided arithmetic coding, as it is proposed herein. After the determination of the LPS, first of all the given interval width R is mapped to a quantized value Q using a tabulated mapping Qtab and a suitable shift operation (by q bit) Alternatively, the quantization may in special cases also be performed without the use of a tabulated mapping Qtab only with the help of a combination of shift and masking operations. Generally, here a relatively coarse quantization to K=2 . . . 8 representative values is performed. Also here, similar to the case of the probability estimation, no explicit determination of Q is performed; rather, only an index q_index is transferred to Q. This index is now used together with the index p_state for a characterization of the current probability state for the determination of the interval width $R_{LPS}$. For this, now the corresponding entry of the table Rtab is used. There, the $K \cdot N_{max}$ product values $R \times P_{LPS}$, that correspond to all K quantized values of R and the $N_{max}$ different from the probability states, are entered as integer values with an accuracy of generally b−2 bits. For practical implementations a possibility is given here to weigh up between the storage requirements for the table size and the arithmetic accuracy which finally also determines the efficiency of the coding. Both target variables are determined by the granularity of the representation of R and $P_{LPS}$.

In the forth step of FIG. 2 it is shown, how the updating of the probability state p_state is performed depending on the above coded event bit. Here, the transition tables Next_State_LPS and Next_State_MPS are used which were already mentioned above in the section "table-aided probability estimation". These operations correspond to the updating process indicated in FIG. 1 in step 4 which is not explained in more detail.

FIG. 3 shows the corresponding flow chart of the table-aided arithmetic decoding. For characterizing the current partial interval in the decoder the interval width R and a value V is used. The latter is present within the partial interval and is refined successively with every read-out bit. As it may be seen from FIG. 3, the operations for the probability estimation and the determination of the interval width R are performed according to those of the encoder.

Coding with Uniform Probability Distribution

In applications in which e.g. signed values are to be coded whose probability distribution is arranged symmetrically around zero, for coding the sign information generally an equal distribution may be assumed. As this information is one the one hand to be embedded in the arithmetic bit stream, while it is on the other hand not sensible to use a relatively compact apparatus of the table-aided probability estimation and interval separation for the case of a probability of p≈0.5, it is for this special case proposed to optionally use a special encoder/decoder procedure which may be illustrated as follows.

In this special case the interval width of the new partial interval may be determined in the encoder by a simple shift operation corresponding to a bisection of the width of the original interval R. Depending on the value of the bit to be coded, the upper or lower half of R, respectively, is then selected as a new partial interval (see FIG. 4). The subsequent renormalization and output of bits is performed as in the above case of the table-aided solution.

In the corresponding decoder the required operations are reduced to determining the bit to be decoded using the value of V relatively to the current interval width R by a simple comparison operation. In the case that the decoded bit is set, V is to be reduced by the amount of R. As it is illustrated in FIG. 4, the decoding is ended by the renormalization and updating of V using the bit to be read in next.

An alternative realization of the coding of events with a uniform probability distribution is illustrated in FIG. 5. In this exemplary implementation the current interval width R is not modified. Instead, V is first doubled by a shift operation in the encoder. Depending on the value of the bit to be coded, then, similar to the above example, the upper or lower half, respectively, of R is selected as a new partial interval (see FIG. 5). The subsequent renormalization and output of bits is performed as in the above case of the table-aided solution with the difference that the doubling of R and L is not performed and that the corresponding comparison operations are performed with doubled threshold values.

In the corresponding decoder of the alternative realization first of all a bit is read out and V is updated. The second step is performed in the same way as step 1 in FIG. 4, i.e. the bit to be decoded is determined using the value of V relative to the current interval width R by a simple comparison operation, and in the case in which the decoded bit is set, V is to be reduced by the amount of R (see FIG. 5).

Addressing and Initializing the Probability Models

Every probability model, as it is used in the proposed invention, is indicated using two parameters: 1) The index p_state that characterizes the probability state of the LPS, and 2) the value valMPS of the MPS. Each of these two variables needs to be initialized at the beginning of the encoding or decoding, respectively, of a completed coding unit (in applications of video coding about one slice). The initialization values may thereby be derived from control information, like e.g. the quantization parameter (of a slice), as it is illustrated as an example in FIG. 6.

Forward-Controlled Initialization Process

A further possibility of adaptation of the starting distributions of the models is provided by the following method. In order to guarantee a better adaptation of the initializations of the models, in the encoder a selection of predetermined starting values of the models may be provided. These models may be combined into groups of starting distributions and may be addressed using indices, so that in the encoder the adaptive selection of a group of starting values is performed and is transmitted to the decoder in the form of an index as page information. This method is referred to as a forward-controlled initialization process.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

REFERENCES

[1] T. Wiegand, G. Sullivan, "*Draft Text of Final Draft International Standard (FDIS) of Joint Video Specification (ITU-T Rec. H. 264/ISO/IEC 14496–10 AVC)*", JVT-G050, March 2003.

[2] D. A. Huffman, "A Method for Construction of Minimum Redundancy code", Proc. IRE, Vol. 40, pp. 1098–1101, 1952.

[3] I. H. Witten, R. M. Neal, J. G. Cleary, "Arithmetic Coding for Data Compression", Communication of the ACM, Vol. 30, No. 6, pp. 520–540, 1987.

[4] G. G. Langdon, J. Rissanen, "A Simple General Binary Source code", IEEE Transactions on Information Theory, Vol. 28, pp. 800–803, 1982.

[5] C. E. Shannon, "A Mathematical Theory of Communication", Bell Syst. Tech. Journal, vol. 27, pp. 379–423, 623–656, 1948.

[6] P. Elias, in "Information Theory and Coding", N. Abramson (Ed.), New York, Mc-Gra-Hill, 1963.

[7] J. Rissanen, "Generalized Kraft Inequality and Arithmetic Coding", IBM J. Res. Develop., Vol. 20, pp. 198–203, 1976.

[8] R. C. Pasco, "Source Coding and Algorithms for Fast Data Compression", Ph. D. Dissertation, Stanford University, USA, 1976.

[9] G. G. Langdon, "An Introduction to Arithmetic Coding", IBM J. Res. Develop., Vol. 28, pp. 135–149, 1984.

[10] A. Moffat, R. M. Neal, I. H. Witten, "Arithmetic Coding Revisited", Proc. IEEE Data Compression Conference, Snowbird (USA), pp. 202–211, 1996.

[11] J. Rissanen, K. M. Mohiuddin, "A Multiplication-Free Multialphabet Arithmetic Arithmetic Code", IEEE Trans. on Communication, Vol. 37, pp. 93–98, 1989.

[12] W. B. Pennebaker, J. L. Mitchell, G. G. Langdon, R. B. Arps, "An Overview of the Basic Principles of the Q-Coder Adaptive Binary Arithmetic Coder", IBM J. Res. Develop., Vol. 32, pp. 717–726, 1988.

[13] P. G. Howard, J. S. Vitter, "Practical Implementations of Arithmetic Coding", in "Image and Text Compression", J. Storer (Ed.), Norwell (USA), Kluwer, 1992.

[14] L. Huynh, A. Moffat, "A Probability-Ratio Approach to Approximate Binary Arithmetic Coding", IEEE Trans. on Information Theory, Vol. 43, pp. 1658–1662, 1997.

[15] D. Chevion, E. D. Karnin, E. Walach, "High-Efficiency, Multiplication Free Approximation of Arithmetic Coding", Proc. IEEE Data Compression Conference, Snowbird (USA), pp. 43–52, 1991.

[16] G. Feygin, P. G. Gulak, P. Chow, "Minimizing Excess Code Length and VLSI Complexity in the Multiplication Free Approximation of Arithmetic Coding", Inform. Proc. Manag., vol. 30, pp. 805–816, 1994.

[17] D. L. Duttweiler, Ch. Chamzas, "Probability Estimation in Arithmetic and Adaptive-Huffman Entropy Coders", IEEE Trans. on Image Processing, Vol. 4, pp. 237–246, 1995.

What is claimed is:

1. A method for an arithmetic encoding and decoding of binary states, characterized in that in a first step a presetable value range for the specification of the interval width R is separated in K representative interval widths $\{Q_1, \ldots, Q_K\}$, a presetable value range for the specification of the probabilities is separated in N representative probability states $\{P_1, \ldots, P_N\}$ and allocation regulations are given, which allocate one $Q_K$ ($1 \leq k \leq K$) to every interval width R and one $P_n$ ($1 \leq n \leq N$) to every probability, and that in a second step the encoding or decoding of the binary states take place by performing the calculation of the new interval width to be derived in the encoding or decoding process, respectively, using a representative interval width $Q_K$ ($1 \leq k \leq K$) and a representative probability state $P_n$ ($1 \leq n \leq N$) by arithmetic operations other than multiplication and division, wherein the representative interval width $Q_K$ is determined by the basic basis interval of the width R and the representative probability state $P_n$ is determined by the probability estimation underlying the symbol to be encoded or to be decoded according to the given allocation regulations.

2. The method according to claim 1, characterized in that based on the interval currently to be evaluated having a width R, for determining the associated interval width $Q_K$, an index q_index is determined by a shift and bit masking operation applied to the computer-internal/binary representation of R.

3. The method according to claim 1, characterized in that based on the interval currently to be evaluated with a width R, for the determination of the associated interval width $Q_K$, an index q_index is determined by a shift operation applied to the computer-internal/-binary representation of R and a downstream access to a table Qtab, wherein the table Qtab contains the indices of interval widths corresponding to values of R prequantized by a shift operation.

4. The method according to claim 1, characterized in that the probability estimation underlying the symbol to be encoded or to be decoded is associated with a probability state $P_n$ with the help of an index p_state.

5. The method according to claim 1, characterized in that the values of the interval width $R_{LPS}$ corresponding to all K interval widths and to all N different probability states are entered into a table Rtab as product values $(Q_K * P_n)$.

6. The method according to claim 1, characterized in that the determination of the interval width $R_{LPS}$ corresponding to the LPS is performed by an access to a table Rtab, wherein the table Rtab contains the values of the interval width $R_{LPS}$ corresponding to all K quantized values of R and to the N different probability states as product values $(Q_K * P_n)$.

7. The method according to claim 1, characterized in that the determination of the interval width $R_{LPS}$ corresponding to the LPS is performed by an access to the table Rtab, wherein, for an evaluation of the table, the quantization index q_index and the index of the probability state p_state are used.

8. The method according to claim 1, characterized in that for the N different representative probability states transition rules are preset, wherein the transition rules indicate which new state is used for the next symbol to be encoded or to be decoded based on the currently encoded or decoded symbol.

9. The method according to claim 8, characterized in that a table Next_State_LPS is created which contains the index m of the new probability state $P_m$ for the index n of the currently given probability state $P_n$ at the occurrence of a least probable symbol (LPS).

10. The method according to claim 8, characterized in that a table Next_State_MPS is created which contains the index m of the new probability state $P_m$ for the index n of the currently given probability state $P_n$ at the occurrence of a most probable symbol (MPS).

11. The method according to claim 1,
characterized in that
the number K of quantization values and/or the number N of the representative states are selected depending on the preset accuracy of the coding and/or depending on the available storage room.

12. The method according to claim 1,
characterized in that
the table-aided encoding includes the following steps:
f) Determination of the LPS
g) Quantization of R:

$$q\_index = Qtab[R>>q]$$

h) Determination of $R_{LPS}$ and R:

$$R_{LPS} = Rtab[q\_index, p\_state]$$

$$R = R - R_{LPS}$$

i) Calculation of the new partial interval:

```
if (bit = LPS) then
    L ← L + R
    R ← R_LPS
    p_state ← Next_State_LPS [p_state]
    if (p_state = 0) then valMPS ← 1 - valMPS
else
    p_state ← Next_State_MPS [p_state]
``` j) Renormalization of L and R, writing bits, wherein

| q_index | describes the index of a quantization value read out of Qtab, |
| p_state | describes the current state, |
| $R_{LPS}$ | describes the interval width corresponding to the LPS and |
| valMPS | describes the bit corresponding to the MPS. |

13. The method according to claim 1,
characterized in that
a table-aided decoding includes the following steps:
a) Determination of the LPS
b) Quantization of R:

$$q\_index = Qtab[R>>q]$$

c) Determination of $R_{LPS}$ and R:

$$R_{LPS} = Rtab[q\_index, p\_state]$$

$$R = R - R_{LPS}$$

d) Determination of bit depending on the position of the partial interval:

```
if (V ≥ R) then
    bit ← LPS
    V ← V - R
    R ← R_LPS
    if (p_state = 0) then valMPS ← 1 - valMPS
```

```
    p_state ← Next_State_LPS [p_state]
else
    bit ← MPS
    p_state ← Next_State_MPS [p_state]
``` e) Renormalization of R, reading out one bit and updating V, wherein

| q_index | describes the index of a quantization value read out of Qtab, |
| p_state | describes the current state, |
| $R_{LPS}$ | describes the interval width corresponding to the LPS, |
| valMPS | describes the bit corresponding to the MPS, and |
| V | describes a value from the interior of the current partial interval. |

14. The method according to claim 1,
characterized in that
in encoding and/or decoding the calculation of the quantization index q_index is performed in the second substep according to the calculation regulation:

$$q\_index = (R>>q) \ \& \ Qmask$$

wherein Qmask illustrates a bit mask suitably selected depending on K.

15. The method according to claim 12,
characterized in that
when a uniform probability distribution is present
in the encoding substeps f to i are performed according to the following calculation regulation:

```
R ← R >> 1
if (bit = 1) then
    L ← L + R
``` or
that the substeps f to i of the encoding are performed according to the following calculation regulation:

```
L ← L << 1
if (bit = 1) then
    L ← L + R
``` and wherein in the last alternative the renormalization of substep j is performed with doubled decision threshold values and no doubling of L and R is performed, and that in the decoding the substeps a to d are performed according to the following calculation regulation:

```
R ← R >>1
if (V ≥ R) then
    bit ← 1
    V ← V - R
else
    bit ← 0,
``` or
the substeps a to e of the decoding are performed according to the following calculation regulation:

m) Reading out one bit and updating V
n) Determination of bit according to the position of the partial interval:

```
if (V ≧ R) then
    bit ← 1
    V ← V – R
else
    bit ← 0.
```

16. The method according to claim 1,
characterized in that
the initialization of the probability models is performed depending on a quantization parameter SliceQP and preset model parameters m and n, wherein SliceQP describes the quantization parameter preset at the beginning of a slice and m and n describe the model parameters.

17. The method according to claim 1,
characterized in that
the initialization of the probability models includes the following steps:
k) preState=min(max(1, ((m*SliceQP)>>4)+n), 2*N)

```
if (preState <=N) then
    p_state = N+1 – preState
    valMPS = 0
else
    p_state = preState – (N+1)
    valMPS = 1,
``` wherein valMPS describes the bit corresponding to the MPS, SliceQP describes the quantization parameter preset at the beginning of a slice and m and n describe the model parameters.

18. The method according to claim 1,
characterized in that
the probability estimation of the states is performed using a finite state machine (FSM).

19. The method according to claim 1,
characterized in that
the generation of the representative states is performed offline.

20. The method according to claim 1,
characterized in that
the selection of the states depends on the statistics of the data to be coded and/or on the number of states.

21. An arrangement having at least one processor and/or chip, which is/are implemented such that a method for an arithmetic encoding and decoding of binary states is may be performed, wherein
in a first step a presetable value range for the specification of the interval width R is separated in K representative interval widths $\{Q_1, \ldots, Q_K\}$, a presetable value range for the specification of the probabilities is separated in N representative probability states $\{P_1, \ldots, P_N\}$ and allocation regulations are given, which allocate one $Q_K$ ($1 \leq k \leq K$) to every interval width R and one $P_n$ ($1 \leq n \leq N$) to every probability, and wherein in a second step the encoding or decoding of the binary states take place by performing the calculation of the new interval width to be derived in the encoding or decoding process, respectively, using a representative interval width $Q_K$ ($1 \leq k \leq K$) and a representative probability state $P_n$ ($1 \leq n \leq N$) by arithmetic operations other than multiplication and division, wherein the representative interval width $Q_K$ is determined by the basic basis interval of the width R and the representative probability state $P_n$ is determined by the probability estimation underlying the symbol to be encoded or to be decoded according to the given allocation regulations.

22. A computer program which enables a computer after it has been loaded into the storage of the computer to perform a method for an arithmetic encoding and decoding of binary states, wherein
in a first step a presetable value range for the specification of the interval width R is separated in K representative interval widths $\{Q_1, \ldots, Q_K\}$, a presetable value range for the specification of the probabilities is separated in N representative probability states $\{P_1, \ldots, P_N\}$ and allocation regulations are given, which allocate one $Q_K$ ($1 \leq k \leq K$) to every interval width R and one $P_n$ ($1 \leq n \leq N$) to every probability, and wherein in a second step the encoding or decoding of the binary states take place by performing the calculation of the new interval width to be derived in the encoding or decoding process, respectively, using a representative interval width $Q_K$ ($1 \leq k \leq K$) and a representative probability state $P_n$ ($1 \leq n \leq N$) by arithmetic operations other than multiplication and division, wherein the representative interval width $Q_K$ is determined by the basic basis interval of the width R and the representative probability state $P_n$ is determined by the probability estimation underlying the symbol to be encoded or to be decoded according to the given allocation regulations.

23. A computer-readable storage medium on which a computer program is stored which enables a computer after it has been loaded into the storage of the computer to perform a method for an arithmetic encoding and decoding of binary states, wherein
in a first step a presetable value range for the specification of the interval width R is separated in K representative interval widths $\{Q_1, \ldots, Q_K\}$, a presetable value range for the specification of the probabilities is separated in N representative probability states $\{P_1, \ldots, P_N\}$ and allocation regulations are given, which allocate one $Q_K$ ($1 \leq k \leq K$) to every interval width R and one $P_n$ ($1 \leq n \leq N$) to every probability, and wherein in a second step the encoding or decoding of the binary states take place by performing the calculation of the new interval width to be derived in the encoding or decoding process, respectively, using a representative interval width $Q_K$ ($1 \leq k \leq K$) and a representative probability state $P_n$ ($1 \leq n \leq N$) by arithmetic operations other than multiplication and division, wherein the representative interval width $Q_K$ is determined by the basic basis interval of the width R and the representative probability state $P_n$ is determined by the probability estimation underlying the symbol to be encoded or to be decoded according to the given allocation regulations.

24. The computer program according to claim 22, which is downloaded from an electronic data network, like for example from the internet, onto a data processing means which is connected to the data network.

25. A method for arithmetically encoding a symbol to be encoded having a binary state based on a current interval width R and a probability representing a probability estimation for the symbol to be encoded, wherein the probability is represented by a probability index for addressing a probability state from a plurality of representative probability states, which method comprises the following steps:

encoding the symbol to be encoded by performing the following substeps:

mapping the current interval width to a quantization index from a plurality of representative quantization indices; and performing the interval separation by accessing an interval division table using the quantization index and the probability index to obtain a partial interval width value.

26. The method of claim 25, wherein the encoding further takes place by the following step:

updating the current interval width using the interval width value to obtain a new, updated interval width.

27. The method of claim 25, wherein the partial interval width value specifies a width of a partial interval for a symbol to be encoded with a less probable state from a current interval with a current interval width.

28. The method of claim 25, wherein updating the current interval width is further performed depending on the binary state of the symbol to be encoded.

29. The method of claim 25, further comprising the following step:

adaptation of the probability estimation, wherein the adaptation of the probability estimation comprises looking up, with the probability index, in an LPS transition rule table (Next_State_LPS) to obtain a new probability index, when the symbol to be encoded has a less probable state, and looking up, with the probability index, in an MPS transition rule table (Next_State_MPS) to obtain a new probability index, when the symbol to be encoded has a more probable state.

30. The method of claim 29, further comprising adjusting a value indicative of the more probable state from a state originally indicated to the binary state of the symbol to be encoded, when the probability index is like a predetermined probability index and the symbol to be encoded has a binary state different from the state originally indicated.

31. The method of claim 25, wherein the substep of updating the current interval width comprises the following steps:

equating the new interval width with the difference of current interval width minus the partial interval width value; and subsequently, if the symbol to be encoded has a less probable state, equating the new interval width with the partial interval width value.

32. The method of claim 25, wherein a current interval is represented by the current interval width and a current offset point, and the encoding is further performed by the following substep:

accumulating the current offset point and a difference of current interval width and partial interval width value to obtain a new, updated offset point, when the symbol to be coded has a less probable state.

33. A method for arithmetically decoding an encoded symbol having a binary state based on a current interval width R and a probability representing a probability estimation for the encoded symbol, wherein the probability is represented by a probability index of a probability state from a plurality of representative probability states, wherein the method comprises the following step:

decoding the encoded symbol by performing the following substeps:

mapping the current interval width to a quantization index from a plurality of representative quantization indices; and performing the interval division by accessing an interval division table using the quantization index and the probability index to obtain a partial interval width value.

34. The method of claim 33, wherein the decoding further takes place by means of the following step:

updating the current interval width using the partial interval width value to obtain a new, updated interval width.

35. The method of claim 33, wherein the partial interval width value specifies a width of a partial interval for an encoded symbol with a less probable state from a current interval with the current interval width.

36. The method of claim 33, wherein updating the current interval width is further performed depending on a value within a new partial interval characterized by the current partial interval width and the value within a new partial interval.

37. The method of claim 36, wherein the decoding is further performed by means of the following substep:

equating the binary state of the encoded symbol with one of a more improbable and a more probable state depending on whether the value within the new partial interval is larger or smaller than a difference of the current interval width and partial interval width value.

38. The method of claim 36, wherein the encoding is further performed by means of updating the value within the new partial interval with a next bit to be read in.

39. The method of claim 36, further comprising the following step:

updating the probability estimation, wherein updating the probability estimation comprises looking up, with the probability index, in an LPS transition rule table (Next_State_LPS) to obtain a new probability index, when the value within the new partial interval is larger than a difference of the current interval width and partial interval width value, and looking up, with the probability index, in an MPS transition rule table (Next_State_MPS) to obtain a new probability index, when the value within the new partial interval is smaller than a difference of the current interval width and partial interval width value.

40. The method of claim 36, further comprising adjusting a value indicative of the more probable state of the encoded symbol from a state originally indicated to a different binary state, when the probability index is like a predetermined probability index and the value within the new partial interval is larger than a difference of the current interval width and partial interval width value.

41. The method of claim 33, wherein the current interval width is represented with an accuracy of b bits, and the partial interval width value obtained from the interval division table is represented with an accuracy of b-2 bits.

42. The method of claim 33, wherein the substep of mapping comprises applying a shift and bit masking operation to a computer-internal/binary representation of the current interval width.

43. The method of claim 33, wherein the substep of mapping comprises applying a shift operation to a computer-internal/binary representation of the current interval width to obtain a quantized value for the current interval width, and a downstream access to a table (Qtab) to obtain the quantization index.

44. The method of claim 33, wherein, in the interval division table, values for the current interval width corresponding to all possible quantization indices and to all probability indices are filed as product values between quantization index, and in a table Rtab.

45. The method of claim 33, further comprising the following step:

updating the probability estimation, wherein updating the probability estimation is performed by means of transition rules, wherein the transition rules specify which new probability state from a plurality of probability states, based on the symbol to be encoded and/or the encoded symbol, will be used for a next symbol to be encoded and/or an encoding symbol.

46. The method of claim 33, further comprising the following step:

updating the probability estimation, wherein updating the probability estimation comprises looking up, with the probability index, in a transition rule table (Next_State_LPS) to obtain a new probability index.

47. The method of claim 33, wherein the number of possible quantization indices and/or the number of the probability states are selected depending on the preset accuracy of the coding and/or depending on the available storage room.

48. The method of claim 33, further comprising the following substep:

renormalizing the new updated offset point and the new, updated interval width.

49. The method of claim 33, wherein decoding includes the following steps:

a) Determination of the LPS
b) Quantization of R:

$$q\_index = Qtab\,[R\!>\!>\!q]$$

c) Determination of $R_{LPS}$ and R:

$$R_{LPS} = R_{tab}[q\_index, p\_state]$$

$$R = R - R_{LPS}$$

d) Determination of bit, depending on the position of the partial interval:

```
if (V ≥ R) then
    bit ← LPS
    V ← V − R
    R ← R_LPS
    if (p_state = 0) then valMPS ← 1 −valMPS
    p_state ← Next_State_LPS [p_state]
else
    bit ← MPS
    p_state ← Next_State_MPS [p_state]
``` e) Renormalization of R, reading out one bit and updating V,
wherein

| | |
|---|---|
| q_index | describes the index of a quantization value read out of Qtab, |
| p_state | describes the current state, |
| $R_{LPS}$ | describes the interval width corresponding to the LPS, |
| valMPS | describes the bit corresponding to the MPS, and |
| V | describes a value from the interior of the current partial interval. |

50. The method of claim 33, wherein, in encoding and/or decoding, mapping to the quantization index q_index is performed according to the calculation regulation:

$$q\_index = (R\!>\!>\!q)\;\&\;Qmask$$

wherein Qmask represents a bit mask suitably selected depending on the number of probability states, R represents the current interval width and q represents a number of bits.

51. The method of claim 33, wherein, in the presence of a uniform probability distribution,
in the encoding, the following calculation regulation is performed:

```
R ← R >> 1
if (bit = 1) then
    L ← L + R,
``` or the following calculation regulation is performed:

```
L ← L >> 1
if bit (bit = 1) then
    L ← L + R
``` and, in the last alternative, a renormalization with doubled decision threshold values is performed and no doubling of L and R is carried out.

52. The method of claim 33, wherein, in the decoding, the following calculation regulation is performed:

```
R ← R >> 1
if (V ≥ R) then
    bit ← 1
    V ← V − R
else
    bit ← 0,
``` or the following calculation regulation:

m) Reading out one bit and updating V
n) Determination of bit depending on the position of the partial interval:

```
if (V ≥ R) then
    bit ← 1
    V ← V − R
else
    bit ← 0.
```

53. The method of claim 33, wherein the initialization of the probability models is performed depending on a quantization parameter SliceQP and preset model parameters m and n, wherein SliceQP describes the quantization parameter preset at the beginning of a slice, and m and n describe the model parameters.

54. The method of claim 33, wherein
the initialization of the probability models includes the following steps:
k) preState=min(max(1, ((m*SliceQP)>>4)+n), 2*N)

```
l) if (preState <=N) then
       p_state = N – preState
       valMPS = 0
   else
       p_state = preState – (N+1)
       valMPS = 1,
``` wherein valMPS describes the bit corresponding to the MPS, SliceQP describes the quantization parameter preset at the beginning of a slice, and m and n describe the model parameters.

55. The method of claim 33, wherein
the probability estimation of the states is performed by means of a finite state machine (FSM).

56. The method of claim 33, wherein
the generation of the probability states is performed offline.

57. The method of claim 33, wherein
the selection of the states depends on the statistics of the data to be coded and/or on the number of the states.

58. An arrangement for arithmetically encoding a symbol to be encoded having a binary state based on a current interval width R and a probability representing a probability estimation for the symbol to be encoded, wherein the probability is represented by a probability index for addressing a probability state from a plurality of representative probability states, the device comprising:
means for encoding the symbol to be encoded, including the following means:
means for mapping the current interval width to a quantization index from a plurality of representative quantization indices; and
means for performing the interval separation by accessing an interval division table using the quantization index and the probability index to obtain a partial interval width value.

59. An arrangement for arithmetically decoding an encoded symbol having a binary state based on a current interval width R and a probability representing a probability estimation for the encoded symbol, wherein the probability is represented by a probability index for addressing a probability state from a plurality of representative probability states, the device comprising:
means for decoding the encoded symbol, comprising the following means:
means for mapping the current interval width to a quantization index from a plurality of representative quantization indices; and
means for performing the interval separation by accessing an interval division table using the quantization index and the probability index to obtain a partial interval width value.

60. A computer program which enables a computer after it has been loaded into the storage of the computer to perform a method for arithmetically encoding a symbol to be encoded having a binary state based on a current interval width R and a probability representing a probability estimation for the symbol to be encoded, wherein the probability is represented by a probability index for addressing a probability state from a plurality of representative probability states, the method comprising the following steps:
encoding the symbol to be encoded by performing the following sub-steps:
mapping the current interval width to a quantization index from a plurality of representative quantization indices; and
performing the interval separation by accessing an interval division table using the quantization index and the probability index to obtain a partial interval width value.

61. A computer program which enables a computer after it has been loaded into the storage of the computer to perform a method for arithmetically decoding an encoded symbol having a binary state based on a current interval width R and a probability representing a probability estimation for the encoded symbol, wherein the probability is represented by a probability index of a probability state from a plurality of representative probability states, the method comprising the following steps:
decoding the encoded symbol by performing the following sub-steps:
mapping the current interval width to a quantization index from a plurality of representative quantization indices; and
performing the interval division by accessing an interval division table using the quantization index and the probability index to obtain a partial interval width value.

62. A computer-readable storage medium on which a program is stored which enables a computer after it has been loaded into the storage of the computer to perform a method for arithmetically encoding a symbol to be encoded having a binary state based on a current interval width R and a probability representing a probability estimation for the symbol to be encoded, wherein the probability is represented by a probability index for addressing a probability state from a plurality of representative probability states, the method comprising the following steps:
encoding the symbol to be encoded by performing the following sub-steps:
mapping the current interval width to a quantization index from a plurality of representative quantization indices; and
performing the interval separation by accessing an interval division table using the quantization index and the probability index to obtain a partial interval width value.

63. A computer-readable storage medium on which a program is stored which enables a computer after it has been loaded into the storage of the computer to perform a method for arithmetically decoding an encoded symbol having a binary state based on a current interval width R and a probability representing a probability estimation for the encoded symbol, wherein the probability is represented by a probability index of a probability state from a plurality of representative probability states, the method comprising the following steps:
decoding the encoded symbol by performing the following sub-steps:
mapping the current interval width to a quantization index from a plurality of representative quantization indices; and
performing the interval division by accessing an interval division table using the quantization index and the probability index to obtain a partial interval width value.

* * * * *